United States Patent [19]

Myers

[11] Patent Number: 4,866,498
[45] Date of Patent: Sep. 12, 1989

[54] INTEGRATED CIRCUIT WITH DISSIPATIVE LAYER FOR PHOTOGENERATED CARRIERS

[75] Inventor: David R. Myers, Albuquerque, N. Mex.

[73] Assignee: The United States Department of Energy, Washington, D.C.

[21] Appl. No.: 183,807

[22] Filed: Apr. 20, 1988

[51] Int. Cl.⁴ .......................................... H01L 27/14
[52] U.S. Cl. ...................... 357/30; 357/42; 357/23.6; 357/23.7; 357/54; 357/59; 357/51
[58] Field of Search ................ 357/30, 42, 23.6, 23.7, 357/54, 54 N, 51, 59 G

[56] References Cited

U.S. PATENT DOCUMENTS

| | | | |
|---|---|---|---|
| 4,314,359 | 2/1982 | Kato et al. | 365/179 |
| 4,350,993 | 9/1982 | Wieder | 357/29 |
| 4,495,219 | 1/1985 | Kato et al. | 427/82 |
| 4,554,570 | 11/1975 | Jastrzebski et al. | 357/23.4 |
| 4,580,157 | 4/1986 | Honda | 357/84 |
| 4,590,508 | 5/1986 | Hirakawa et al. | 357/41 |
| 4,593,458 | 6/1986 | Adler | 29/576 W |
| 4,604,639 | 8/1986 | Kinoshita | 357/23.6 |
| 4,611,386 | 9/1986 | Goto | 29/576 W |

FOREIGN PATENT DOCUMENTS

| | | | |
|---|---|---|---|
| 55-093239 | 7/1980 | Japan . | |
| 54-33309 | 9/1980 | Japan . | |
| 54-67177 | 12/1980 | Japan . | |
| 55-35875 | 10/1981 | Japan . | |
| 57-107024 | 7/1982 | Japan | 357/29 |
| 55-184580 | 7/1982 | Japan . | |
| 59-145365 | 9/1982 | Japan | 357/42 |
| 60-12898 | 3/1985 | Japan | 357/30 I |

OTHER PUBLICATIONS

No Author, "Method to fabricate CMOS on Insulator," *IBM Technical Disclosure Bulletin*, vol. 28, No. 7, Dec. 1985, pp. 3120-3122.
Anantha et al., "Process to Fabricate a Bipolar IC with Reduced Alpha Particle Damage, " *IBM Technical Disclosure Bulletin*, vol. 22, No. 12, May 80, 5365-5366.
Kamins et al., "Patterned Implanted Buried-Oxide Transistor Structures" *J. Applied Physics*, vol. 60, No. 1, Jul. 1, 1986, pp. 423-426.
Myers et al., "Characterization of Buried-Nitride Silicon for Integrated Circuit Applications", Materials Research Society Symp. Proc., vol. 93, Apr. 1987, pp. 11-117.
Schlesier et al., "CMOS Hardening Techniques," RCA Laboratories, 1973, pp. 225-281.
K. Schlesier & P. Morris, "CMOS Hardening Techniques", RCA Laboratories, 1973, pp. 275-281.
R. Donovan & M. Simons, "Radiation Hardening of Thermal Oxides On Silicon by Displacement Damage", *J. Applied Physics*, vol. 43, No. 6 Jun. 1972, pp. 2897-2899.
J. Tihanyi & H. Schlotterer, "Influence of the Floating Substrate Potential on the Characteristics of ESFI MOS Transistors", *Solid-State Electronics*, 1975, vol. 18, pp. 309-314.
M. Poponiak & T. Yeh, "Gettering Utilizing Implant Damage and Highly Disordered Epitaxial Layer", *IBM Technical Disclosure Bulletin*, vol. 19, No. 6, Nov. 1976, pp. 2052-2053.
J. Repace & A. Goodman, "The Effect of Process Variations On Interfacial and Radiation-Induced Charge in Silicon-On-Sapphire Capacitors", *IEEE Transactions On Electron Devices*, vol. ED-25, No. 8, Aug. 1978, pp. 978-982.
W. Ward, "Alpha Particle Shield", *IBM Technical Disclosure Bulletin* vol. 22, No. 4, Sep. 1979, p. 1398.

(List continued on next page.)

*Primary Examiner*—William A. Mintel
*Attorney, Agent, or Firm*—George H. Libman; James H. Chafin; Judson H. Hightower

[57] ABSTRACT

The sensitivity of an integrated circuit to single-event upsets is decreased by providing a dissipative layer of silicon nitride between a silicon substrate and the active device. Free carriers generated in the substrate are dissipated by the layer before they can build up charge on the active device.

7 Claims, 1 Drawing Sheet

OTHER PUBLICATIONS

T. May & M. Woods, "Alpha-Particle-Induced Soft Errors In Dynamic Memories", *IEEE Transactions On Electron Devices*, vol. ED-26, No. 1 Jan. 1979, pp. 2-9.

L. Sivo et al., "Cosmic Ray-Induced Soft Errors In Static MOS Memory Cells", *IEEE Transactions On Nuclear Science*, vol. NS-26, No. 6, Dec. 1979, pp. 5042-5047.

N. Anantha & G. Srinivasan, "Process to Fabricate a Bipolar IC With Reduced Alpha Particle Damage", *IBM Technical Disclosure*, Vol. 22, No. 12, May 1980, pp. 5365-5366.

S. Diehl et al. "Considerations For Single Event Immune VLSI Logic", *IEEE Transactions on Nuclear Science*, vol. NS-30, No. 6, Dec. 1983, pp. 4501-4507.

T. Mnich et al., "Comparison of Analytical Models and Experimental Results For Single Event Upset In CMOS SPRAMs", *IEEE Transactions On Nuclear Science*, vol. NS-30, No. 6, 12/83, pp. 4620-4623.

B. Tsaur et al., "Effects of Ionizing Radiation on SOI/CMOS Devices Fabricated In Zone-Melting-Recrystallized Si Films On SiO2", IEEE Electron Device Ltrs., vol. EDL-5, No. 7, 07/84, pp. 238-240.

G. Davis et al., "Transient Radiation Effects in SOI Memories", *IEEE Transactions On Nuclear Science*, vol. NS-32, No. 6, Dec. 1985, pp. 4432-4437.

T. Kanins et al., "Patterned Implanted Buried-Oxide Transistor Structures", *J. Applied Physics*, Vol. 60, No. 1, July 1, 1986, pp. 423-426.

D. Myers et al., "Characterization of Buried-Nitride Silicon For Integrated Circuit Applications", *Materials Research Society Symp.* Proc., Vol. 93, April 1987, pp. 113-117.

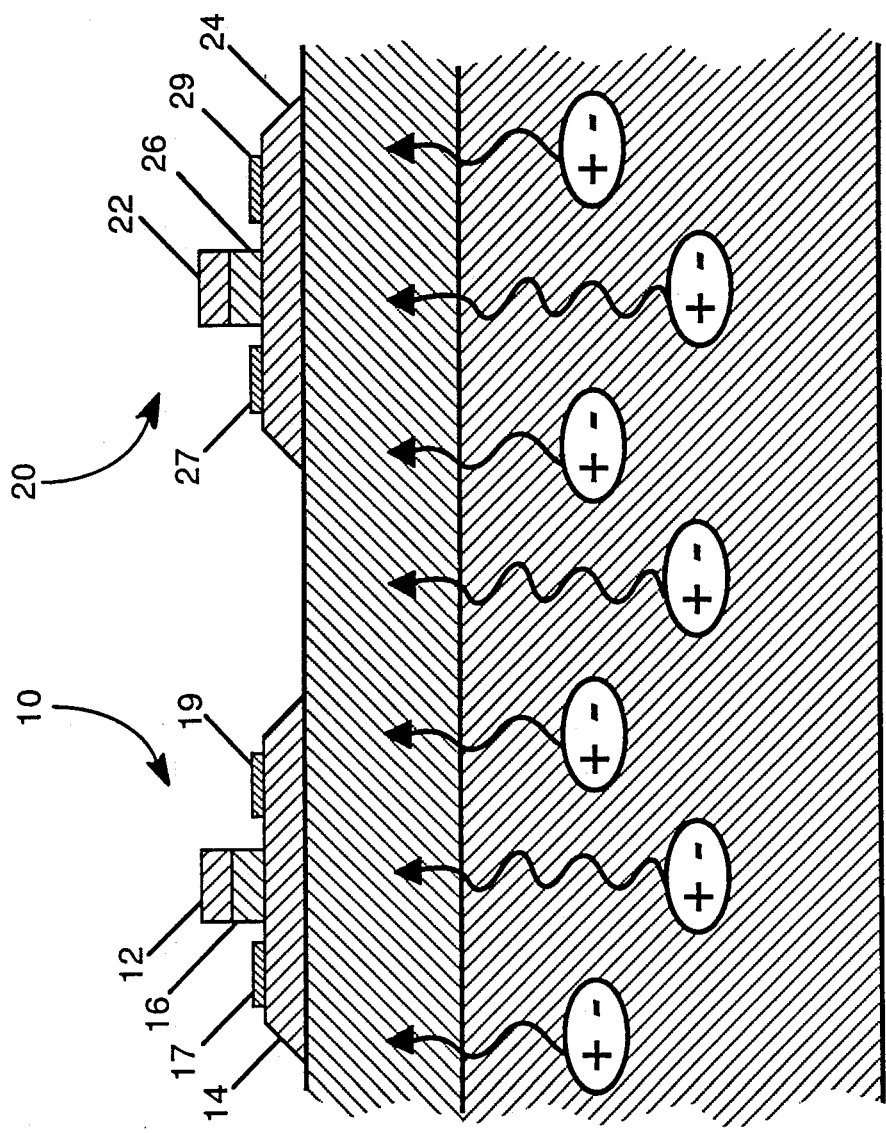

INTEGRATED CIRCUIT WITH DISSIPATIVE LAYER FOR PHOTOGENERATED CARRIERS

The U.S. Government has rights in this invention pursuant to Contract No. DE-ACO4-76DP00789 between the Department of Energy and AT&T Technologies, Inc.

BACKGROUND OF THE INVENTION

This invention related generally to a radiation-hardened integrated circuit, and more specifically to an integrated circuit with a partially insulating layer between the active element and substrate to dissipate photogenerated carriers from the substrate.

Continued advances in the fabrication of electronic devices for use in integrated circuits have led to dramatic improvements in performance and decreases in the physical dimensions of active electronic devices. However, such devices have also become increasingly sensitive to logic upset from the collection of electron-hole pairs created by ionizing radiation which strikes the device substrate. A particular concern arises from cosmic radiation in a space environment or from fission fragments produced by the radioactive decay of contaminants found in typical packaging materials used in integrated circuit manufacturing. This phenomenon is commonly referred to as "single-event upset" (SEU).

The problem typically occurs in complementary logic circuits involving two semiconductor devices connected such that one device is either "on" or "off" while the other device is in the alternate state. Such a situation is discussed in S. Diehl et al., "Considerations for Single Event Immune VLSI Logic", IEEE Trans. Nuc. Sci., Vol. NS-30, No. 6, December 1983, pp. 4501–4507, where a cosmic ray strike near the depletion region of the "off" transistors of a CMOS RAM cell causes the collection of excess carriers which are swept out by the electric field of the drain and collected as an increase in reverse saturation current. This current charges the internal gate capacitance of the "on" transistors. If this gate voltage becomes sufficiently high, the logic circuit will switch.

Two approaches to reducing the likelihood of device upset from collected carriers are known: (1) the use of insulating regions under the active device area and (2) the use of dissipative circuit elements (capacitive and resistive) to reduce the rate of current transfer between the coupled inverters of a RAM cell.

The first approach removes the semiconductor region under the active device areas and replaces it with a wide bandgap insulating region. This insulating region acts as a barrier to charge flow, thereby reducing the amount of collected charge and, therefore, the likelihood of logic state upset. This approach may be implemented either by using an insulating substrate, e.g. silicon "on" sapphire, or by providing an insulating layer of a material such as silicon dioxide between the active device and the silicon substrate, e.g., silicon-on-insulator.

The use of a completely insulating barrier under the active device prevents photocurrents generated in the substrate from reaching the device. However, the insulating barrier also leads to other destabilizing effects. The ionizing radiation can induce a permanent positive charge near the silicon-sapphire interface, causing the formation of a permanent conducting channel in the transistors, independent of gate control (J. Repace et al., "The Effect of Process Variations on ... Charge in Silicon-on-Sapphire Capacitors", IEEE Trans. Electron Devices, Vol. ED-25, No. 8, August 1978, pp. 978–982). In addition, the lack of electrical contact through the substrate between the FET devices causes the "kink" effect and photocurrent multiplication by a parasitic bipolar phototransistor.

As reported by J. Tihanyi et al., "Influence of the Floating Substrate Potential on the Characteristics of ESFI MOS Transistors", Solid-State Electronics, 1975, Vol. 18, pp. 309–314, impact ionization of carriers near the drain of a n-channel FET creates excess holes. For such a transistor operating in bulk silicon, these excess holes are extracted by the substrate bias. However, in silicon-on-insulator technologies, the dielectric acts as a barrier to current flow, preventing extraction of the hole current. The excess holes are repelled by the positive biases applied to the drain of the transistor and accumulate at the p-n junction in the source region. This accumulated positive charge forward biases the source-channel p-n junction, creating excess current and thereby preventing the realization of a unique drain current as a function of gate bias. This effect is intrinsic to the device under certain operating conditions, and does not require external ionizing radiation to create the effect.

G. Davis et al., "Transient Radiation Effects in SOI Memories", IEEE Trans. Nucl. Sci., NS-32, No. 6, December 1985, pp. 4432–4437, reports an additional destabilizing effect of SOI MOSFET caused by current multiplication by a parasitic bipolar phototransistor action that occurs within the MOSFET. Although the amount of charge that is collected in SOI technology is reduced to the thickness of the device active regions (which regions are much smaller than the substrate thickness), the current from the active regions that is collected is amplified by the parasitic phototransistor action, thereby negating the insulating intent of the SOI structure.

To prevent the kink effect and other anomalies resulting from the use of a fully insulting layer under the active device regions, a patterned buried oxide layer has been proposed. T. Kamins et al., "Patterned implanted buried-oxide transistor structures", J. Appl. Phys 60(1), 1 July 1986, pp. 423–426. This approach uses a buried silicon dioxide (insulating) layer under only the source and drain regions of FETs, allowing the extraction of hole currents resulting from impact ionization in the high-field regions near the FET drain (to eliminate the kink effect) and allowing resistive contact to the base of the parasitic bipolar transistor (to reduce its effect). However, since this approach does not shield the FET from substrate-generated photocurrents (the largest source of such photocurrents), it is not effective against SEU.

The other approach to reducing device upset relies on the insertion of a decoupling resistor in the polysilicon interconnections between the inverters in a CMOS RAM cell. In this approach, the excess photogenerated charge collected by the drain of the "off" transistor is delayed by the RC time constant of the interconnect-gate capacitor combination. For an RC time constant greater than the excess carrier lifetime, the excess charge recombines before destabilizing the logic state of the opposite inverter, thereby eliminating SEU. Since the dissipative element is part of the path for signal propagation in the integrated circuit, the RC time constant of the interconnect-gate capacitor also slows the desired propagation of logic signals, thereby slowing circuit operation without regard to the presence of ionizing radiation.

A related approach reported by Diehl et al. is to add sufficient capacitance at sensitive nodes to maintain ion-induced voltage transients below upset level. This technique tends to increase the surface area of the active device.

SUMMARY OF THE INVENTION

It is an object of this invention to provide a SEU-hardened integrated circuit without increasing surface area or slowing signal response time.

It is another object of this invention to provide an integrated circuit with a dissipative, distributed, resistance and capacitance layer between the device and a substrate.

It is a further object of this invention to provide an integrated circuit with a leaky dielectric layer between the device and a substrate.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention as embodied and broadly described herein, the present invention may comprise an integrated circuit comprising a substrate; a semiconductor device sensitive to photogenerated carriers; and a dissipative layer, extending between the substrate and the device over the entire area of the device, for conducting a DC bias current between the device and the substrate. The layer has an RC time constant greater than the time constant characteristic of photogenerated minority lifetimes. In a preferred embodiment of the invention, the dissipative layer is made of silicon nitride.

BRIEF DESCRIPTION OF THE DRAWINGS

The accompanying drawing, which is incorporated in and forms part of the specification, illustrates an embodiment of the present invention and, together with the description, serve to explain the principles of the invention.

The FIGURE shows a cross-section of an integrated circuit having the layer of this invention.

DETAILED DESCRIPTION

This invention consists of the relocation of the dissipative resistor-capacitor path used between active devices in prior art resistive decoupling schemes to a unique location between the active electronic device and the substrate ground plane. The invention differs from the prior art silicon-on-insulator technologies in that the invention allows a highly resistive coupling of active device regions to the substrate through a dissipative element, rather than having complete electrical isolation that results from an insulating barrier.

The FIGURE shows a representative logic circuit 1 in accordance with the invention to include a pair of complementary logic (n-channel, p-channel) FET devices 10, 20. Each of devices 10, 20 may include a polysilicon gate 12, 22 located above a thin silicon dioxide layer 16, 26, that is located above a thin silicon layer 14, 24. Each device also includes conventional source electrodes 17, 27 and drain electrodes 19, 29. Devices 10, 20 are typically connected to each other by conventional surface electrodes (not shown) to form a complimentary logic circuit wherein each device could assume either an "on" or "off" state, although each circuit is never in the same state as the other circuit.

It should be understood that the details of the active device are well known to those of ordinary skill in the art and are not considered to be part of this invention. Furthermore, although the preferred embodiment described herein is a complimentary logic FET device, the invention may be practiced with any active device subject to SEU, including a plurality of FET logic or memory elements, or an optical photodetector either alone or in combination with integrated transistors.

The purpose of silicon layers 14, 24 is to provide a surface for attaching devices 10, 20 to substrate 50 through partially insulating layer 30. Substrate 50 may be a typical silicon substrate having a thickness on the order of 1 mm. This amount of silicon is a large target for impinging radiation to strike, causing the free carriers that result in SEU. However, since these carriers have to pass through partially insulating layer 30, which layer has an RC time constant greater than the time constant characteristic of photogenerated minority lifetimes, the carriers recombine into harmless electron-hole pairs in layer 30 before causing SEU. Furthermore, since layer 30 has a high, but finite, resistance, a bias current can flow between devices 10, 20 and substrate 50 to remove the excess carriers that cause the kink effect.

Partially insulating layer 30 may be formed by several techniques that produce structure having the required electrical properties. In one preferred embodiment, layer 30 is formed of silicon nitride.

In one experiment, a sacrificial layer of silicon dioxide of approximately 35 nm thickness was grown over several 100 mm diameter, (100)-oriented, 1–4 ohm-cm, n-type silicon wafers. These wafers were then implanted with $4 \times 10^{17}/cm^2$, 300 keV, nitrogen dimers (for a net dose of $8 \times 10^{17}/cm^2$, 150 keV nitrogen atoms) at a scanned ion current of approximately 2 uA/cm². During implant, the wafers were clamped to a stainless steel target fixture that was held at a constant temperature of 773 K. Following implantation, the remaining sacrificial oxide was removed, CVD oxide deposited, and the wafers were annealed at 1473 K for 5 hours under flowing nitrogen. Some of these wafers were sacrificed to determine the composition of the resulting structure. The remaining wafers had 2 um of 1 ohm-cm, n-type epitaxial silicon grown over the surface silicon to allow transistor fabrication using a p-well CMOS process.

Rutherford backscattering (RBS) shows implantations resulted in broad distribution of nitrogen atoms within the silicon substrate. The as-implanted nitrogen distribution corresponded to a dark band in the X-TEM between 210 nm and 355 nm from the silicon surface. Upon annealing, the spectrum of this band became characteristic of silicon nitride. The peak nitrogen density in the annealed film contains about 20% excess silicon compared to that of stoichiometric silicon nitride. The layer showed other properties consistent with results reported for similar nitride implants and anneals by other workers.

Hall effect measurements on the implanted and annealed silicon surface layer above the buried nitride layer indicate p-type surface conduction. This conduction could arise from contamination of either the ion beam or the processing environment, or could be associated with defect or interface states created by the irregular regrowth of the recrystallized nitride. Impurities at the parts/million level would be sufficient to yield the observed doping level.

Conductance and capacitance measurements were performed on 2 mm square die cut from the annealed wafers. Conductance of the die varied from a minimum of 0.1 mS at zero bias to a maximum of 1.35 mS for positive bias on the surface of the silicon. If an average thickness for the buried nitride is assumed to be 150 nm, the resistivity of the buried nitride layer is approximately $10^8$ ohm-cm near zero bias. The capacitance of the die was 270 pF at zero bias and 90 pF for 10 V reverse bias, measured at 100 kHz. The resulting time constant for this range of typical operating parameters is on the order of 300 ns, a value which far exceeds the 250 ps time constant characteristic of ionizing radiation-induced minority carriers, as required for use in this invention.

The transistors grown on the nitride-implanted wafers were subjected to doses of radiation. The resulting tests showed these transistors to have received only one half the collected charge from the radiation of similar transistors grown on silicon wafers without the nitride layer.

It should be recognized that the tested structure was chosen because the facilities for making such structure were available, not because it provided an ideal structure in accordance with this invention. Ideally, the dissipative silicon nitride layer 30 would be located as close to the active element as possible. For example, it could be formed directly on the silicon substrate, and a thin layer of silicon corresponding to layers 14, 24 could be deposited over it. The tested transistors included a 2 um layer of epitaxial silicon between the nitride layer and the transistor electrodes. This silicon layer is another target for radiation to produce photogenerated carriers that will not be blocked by the nitride layer. For example, if the thickness of this layer is reduced to 0.2 um, the collected charge should be reduced by a factor of 10 by the partially insulating layer 30.

In a second embodiment of the invention, layer 30 could be formed of a layer of insulating material of sufficient thinness to support conduction. Although the mode of conduction is not fully understood, it is known that a layer of silicon dioxide on the order of 100 Angstroms (0.01 um) thick will support dc conduction with a high (above $10^6$ ohm-cm) resistivity. Such a layer could also be used as partially insulating layer 30 in the practice of this invention.

The particular sizes and equipment discussed above are cited merely to illustrate a particular embodiment of this invention. It is contemplated that the use of the invention may involve components having different sizes and shapes as long as the principle of using a dissipative layer between an active device and a conductive substrate is followed. For example, other materials resistive materials may be used in place of silicon nitride. It is intended that the scope of the invention be defined by the claims appended hereto.

I claim:
1. An integrated circuit comprising:
    a substrate comprising a first material;
    a semiconductor device sensitive to photogenerated carriers, said device covering an area of said substrate; and
    (dissipative) partially insulating layer means, formed of a second material different from said first material and extending between said substrate and said device over all of said area, for conducting a DC current between said device and said substrate, said layer means having an RC time constant greater than the time constant characteristic of photogenerated minority lifetimes.

2. The integrated circuit of claim 1 wherein said second material consists of nonstoichiometric silicon nitride.

3. The integrated circuit of claim 2 wherein said layer means is on the order of 2000 A thick.

4. The integrated circuit of claim 1 wherein said partially insulating layer consisting of a layer silicon dioxide of sufficient thinness to support DC conduction.

5. The integrated circuit of claim 1 wherein said semiconductor device comprises two semiconductor devices formed on said substrate, each said device being electrically switchable between a first condition and a second condition, said devices being interconnected such that the condition of one device is always opposite the condition of the other device.

6. The integrated circuit of claim 5 wherein said two semiconductor devices comprise a complementary logic circuit.

7. The integrated circuit of claim 6 wherein said devices are MOS FETs.

* * * * *